(12) United States Patent
Saffman et al.

(10) Patent No.: US 11,868,095 B2
(45) Date of Patent: Jan. 9, 2024

(54) ALKALI METAL OPTICAL CLOCK

(71) Applicant: Wisconsin Alumni Research Foundation, Madison, WI (US)

(72) Inventors: Mark Saffman, Madison, WI (US); Shimon Kolkowitz, Madison, WI (US); Arjav Sharma, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 17/654,888

(22) Filed: Mar. 15, 2022

(65) Prior Publication Data
US 2023/0297033 A1    Sep. 21, 2023

(51) Int. Cl.
*G04F 5/14* (2006.01)
*H03L 7/26* (2006.01)

(52) U.S. Cl.
CPC ............... *G04F 5/145* (2013.01); *H03L 7/26* (2013.01)

(58) Field of Classification Search
CPC ........................................................ G04F 5/145
USPC ........................................................... 331/94.1
See application file for complete search history.

(56) References Cited

U.S. PATENT DOCUMENTS

| 2013/0265112 A1* | 10/2013 | Strabley | G04F 5/14 |
| | | | 331/94.1 |
| 2015/0194972 A1* | 7/2015 | Katori | H03L 7/26 |
| | | | 331/94.1 |
| 2020/0116623 A1* | 4/2020 | Cooper-Roy | G01N 21/6404 |
| 2020/0275547 A1* | 8/2020 | Imai | H05H 3/02 |
| 2021/0028595 A1* | 1/2021 | Chen | H01S 3/223 |

OTHER PUBLICATIONS

Andrew Ludlow et al.; "Optical atomic clocks." Reviews of Modern Physics vol. 87, No. 2 (Apr./Jun. 2015): pp. 637-701. US.
Jun Ye et al.; "Quantum state engineering and precision metrology using state-insensitive light traps." science 320, No. 5884 (2008): pp. 1734-1738. US.
A. W. Carr et al.; "Doubly magic optical trapping for Cs atom hyperfine clock transitions." Physical Review Letters 117, No. 15 (Oct. 2016): pp. 150801-1-150801-6 and Supplementary Information pp. 1-9. US.
S. Zhang et al.; "Magic-wavelength optical traps for Rydberg atoms." Physical Review A 84, No. 4 (Oct. 2011): p. 043408-1-043408-8; US.

\* cited by examiner

*Primary Examiner* — Joseph Chang
(74) *Attorney, Agent, or Firm* — Boyle Fredrickson, S.C.

(57) ABSTRACT

An atomic clock employs alkali metal atoms such as cesium normally used for microwave atomic clocks but with optical stimulation. While alkali metals provide light emissions having a spectral width being as much as $10^7$ wider (and hence less precise) than alkali earth materials commonly targeted for optical atomic clocks, the present inventors have determined that this disadvantage is significantly reduced by improved signal-to-noise ratio in the obtained signal making practical an atomic clock with improved size, weight, and power consumption.

21 Claims, 3 Drawing Sheets

ALKALI METAL OPTICAL CLOCK

STATEMENT REGARDING FEDERALLY SPONSORED RESEARCH OR DEVELOPMENT

This invention was made with government support under FA9550-21-1-0034 awarded by the USAF/AFOSR. The government has certain rights in the invention.

CROSS REFERENCE TO RELATED APPLICATION

Not Applicable

BACKGROUND OF THE INVENTION

The present invention relates to atomic clocks and in particular to an optical atomic clock having improved size, weight, and power consumption with respect to current optical atomic clocks.

Precise time signals used for establishing international time standards as well as in sophisticated electronics such as global positioning systems currently use microwave atomic clocks. These microwave atomic clocks measure time with reference to microwaves resonant with cesium or rubidium atoms transitioning between defined energy states.

Recently, optical atomic clocks have been developed that reference laser light to optical transitions in elements such as ytterbium or strontium. Light that is on resonance with these optical clock transitions has frequencies 5 orders of magnitude higher than the microwaves on resonance with the clock transitions in cesium or rubidium and comparable linewidths offering greatly increased stability and accuracy.

Current high-performance optical atomic clocks are laboratory scale devices, greatly limiting their application to many important research and commercial tasks.

SUMMARY OF THE INVENTION

The present invention provides an atomic clock employing optical transitions in alkali metal atoms such as cesium or rubidium. While the line width of these transitions is much broader than that possible with elements such as ytterbium or strontium (about $10^7$ times wider), the present inventors have recognized this disadvantage can be offset in a properly designed clock by greatly increasing the number of detection events per time permitting production of a clock that improves on current microwave atomic clocks in accuracy and precision but with greatly improved size, weight, and power requirements relative to strontium or ytterbium clocks. The simplicity of the design and long probe times allows the use of parallel multiple atomic samples for continuous operation, further increasing accuracy.

More specifically, in one embodiment, the invention provides an atomic clock having a source of alkali metal atoms and a first laser providing an optical trap for holding the atoms received from the source. A second laser optically probes the trapped atoms in transition from a ground state to an excited energy state; and a lock circuit monitors light from the decay of trapped atoms to the ground state to generate a clock output signal.

It is thus a feature of at least one embodiment of the invention to provide an atomic clock with greatly reduced size, weight, and power requirements competitive with or outperforming current microwave atomic clocks by employing optically probed alkali metal atoms instead of alkali earth materials and the like.

The alkali metal atom may be cesium.

It is thus a feature of at least one embodiment of the invention to employ the well-characterized cesium tools and techniques currently used in microwave atomic clocks.

The second laser may provide a wavelength of 685 nm to resonantly probe a narrow transition of neutral cesium atoms between the $6s_{1/2}$ and $5d_{5/2}$ states.

It is thus a feature at least one embodiment of the invention to provide a set of transitions compatible with simplified cooling and operation of the clock and which permit multiple probe cycles between loading of the traps.

The first laser may provide an optical trap using a wavelength selected from the group consisting of 803 nm and 683 nm.

It is thus a feature of at least one embodiment of the invention to provide a system that provides "magic" trap wavelengths for trap stability in the ground and excited cesium states such as promotes multiple probe cycles between loadings of the traps.

The first laser may create a lattice trap having multiple trap locations arrayed with multiple locations. In some cases, the multiple locations may include trap locations separated in each of three dimensions.

It is thus a feature of at least one embodiment of the invention to greatly increase the number of probed atoms thus boosting the signal-to-noise ratio to offset the wider line width of alkali metal atoms.

Each of the locations may stably hold only a single atom.

It is thus a feature of at least one embodiment of the invention to reduce broadening of the line width that can result from atomic collisions in the traps.

Each of the locations provides a single defined polarization of trap light.

It is thus a feature of at least one embodiment of the invention to simplify the atomic response to the trapping light and reduce AC Stark shills in the transition levels that would affect accuracy.

The lattice trap may employ a single laser creating multiple trap locations from Talbot patterns in electromagnetic energy passed through a set of diffraction orifices over a two-dimensional array.

It is thus a feature of at least one embodiment of the invention to greatly increase the population of probed atoms using a simple trapping structure that can be implemented with as little as one laser diode.

The optical trap may be placed within an optical resonator tuned to a frequency of the second laser.

It is thus a feature of at least one embodiment of the invention to suppress Doppler broadening and recoil heating of the trapped atoms by suppressing sideband excitation.

The optical resonator may provide opposed mirrors including at least one mirror surface formed from an end of a fiber optic communicating between the trap and the pump laser.

It is thus a feature of at least one embodiment of the invention to provide an extremely simple and robust optical resonator intrinsically aligned with the optical paths from the lasers consistent with the simplified laser structure of the present invention.

The lock circuit may analyze the light from the decay of trapped atoms between different magnetic quantum numbers having opposite response to magnetic fields to compensate for external magnetic fields.

It is thus a feature of at least one embodiment of the invention to provide an atomic clock using transition levels amenable to magnetic field compensation.

The atomic clock may include two different traps, and the lock circuit may alternately switch from receiving light from the first trap to receiving light from the second trap while the first trap is replenished with atoms, and from receiving light from the second trap to receiving light from the first trap when the second trap is replenished with atoms to allow continuous regulation of the clock output signal.

It is thus a feature of at least one embodiment of the invention to provide a clock that can offer a high sample rate that is uninterrupted by repumping operations, possible because of the short reloading time compared to probing time possible in the present design.

The atomic clock may further include a third laser providing cooling of the atoms to microkelvin motional temperatures.

It is thus a feature of at least one embodiment of the invention to provide an atomic clock that can operate with as few as three lasers.

The lock circuit may operate to load a first set of atoms into the trap and to pump the first set of atoms from the ground state to an excited energy state and monitor light from the decay of trapped atoms to the ground state multiple times over a probing period. In some embodiments, the probing period is more than one second.

It is thus a feature of at least one embodiment of the invention to provide a high sample rate uninterrupted by frequent reloading.

The atoms at the trap sites may be entangled by Rydberg interactions.

It is thus a feature of at least one embodiment of the invention to provide an atomic clock with quantum-enhanced performance.

These particular objects and advantages may apply to only some embodiments falling within the claims and thus do not define the scope of the invention.

DETAILED DESCRIPTION OF THE PREFERRED EMBODIMENT

Figure 1:
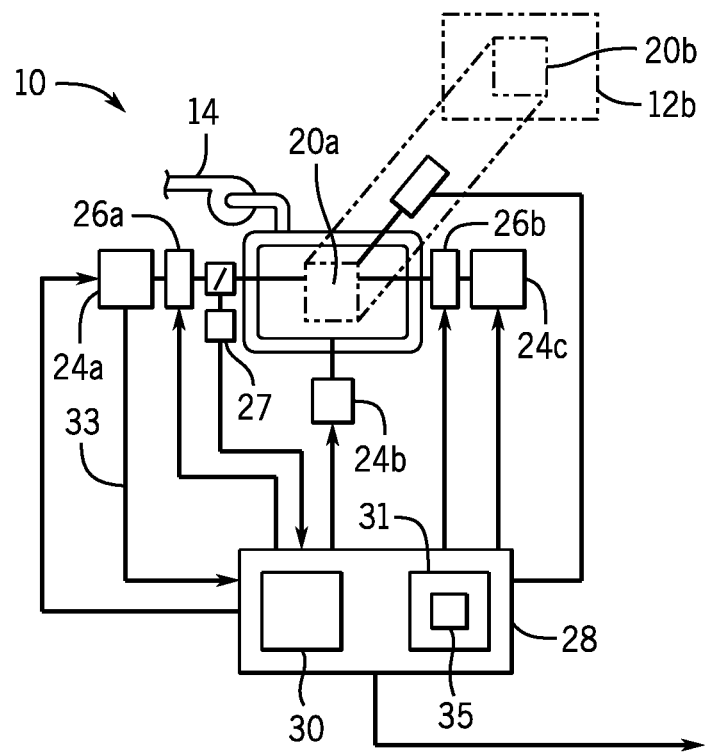
FIG. 1 is a simplified block diagram of the atomic clock of the present invention showing in detail one of two evacuated chambers for holding alkali metal atoms in a lattice trap as well as trapping, cooling, and pumping lasers which may be shared among the chambers.

Referring now to FIG. 1, an atomic clock 10 according to one embodiment of the present invention may provide a first and second chamber 12a and 12b each enclosing a volume that may be evacuated, for example, by a vacuum pump system 14 to an ultrahigh vacuum level (10-7 Pa). Generally the chambers 12 may operate in a temperature stabilized environment (e.g., a temperature controlled insulated oven) and may include magnetic shielding, for example, mu metal as well as electrostatic shielding using Faraday cage type structures to reduce electrical and magnetic influence. While the chambers 12 are depicted as being physically separate for clarity of illustration, it is anticipated that a single structure can be used for both chambers so that they may share other elements of the atomic clock as will be described.

Figure 2:
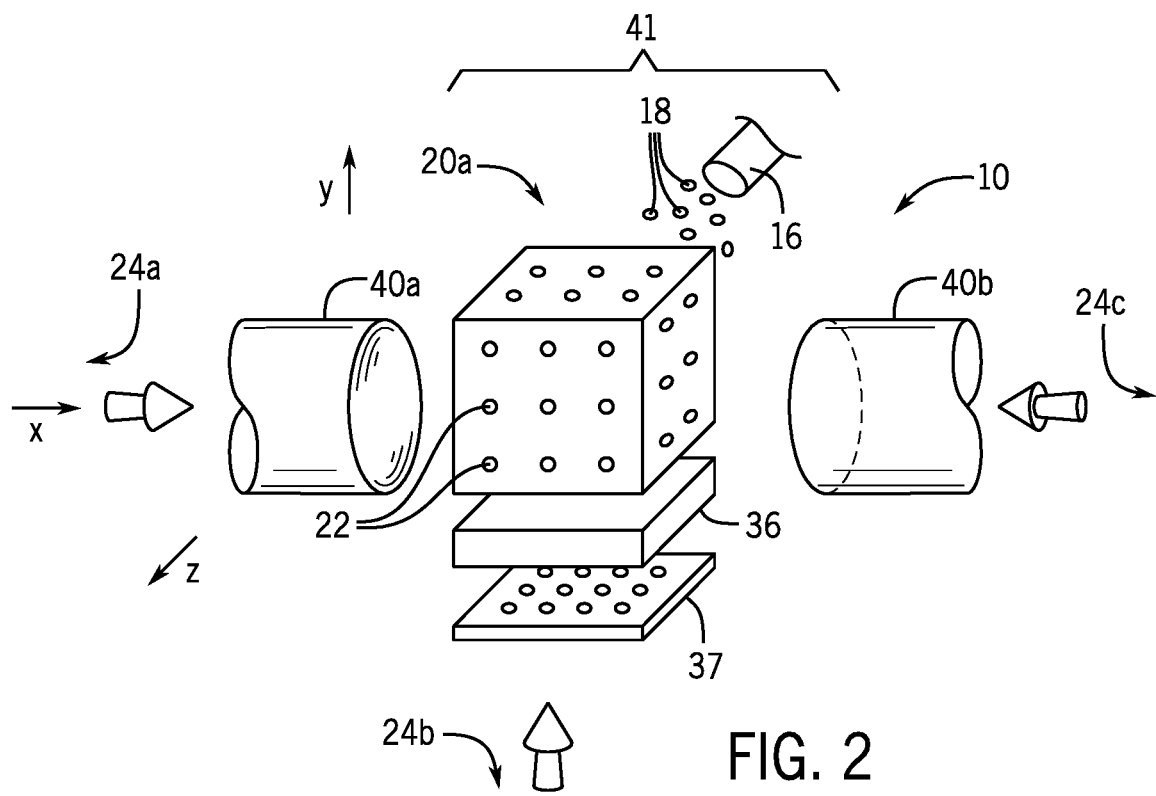
FIG. 2 is a detailed oblique projection of one lattice trap structure and associated optical cavity formed by fiber optics.

Referring now also to FIG. 2, an alkali metal source 16 may provide for the introduction of alkali metal atoms 18 into chambers 12 to be received by a trap region 20 where individual atoms will be cooled and captured at trap sites 22. For the purpose of the following discussion, it will be assumed that the atoms 18 are cesium; however, the invention also contemplates the use of rubidium. In addition, certain features of the invention may also be applicable to clocks based on other materials currently being investigated for optical atomic clocks. Extensions to these other materials will be apparent to those of ordinary skill in the art from the following description and explanation.

Referring still to FIGS. 1 and 2, a set of three lasers 24a-24c may also communicate with the chambers 12 and the trap region 20 to provide cooling, probing, pumping, and trapping radiation. Light from the lasers 24a and 24b may pass along a common x-axis entering the trap region 20 from opposite sides. Before entering the chambers 12, light from the lasers 24a and 24b passes through acoustical optical modulators (AGMs) 26a and 26b, respectively, allowing frequency modulation of that light as discussed below. This light is polarized along the z axis The remaining laser 24b may be directed along the y-axis perpendicular to the light from the lasers 24a and 24b and may have a polarization along z and, in this example, a wavelength of 803 nm. As described all lasers are polarized along the same, z direction. Generally, the lasers 24 may be semiconductor lasers with semiconductor amplifier chips providing tapered output amplifiers.

Referring to FIG. 2, the trap region 20 provides a three-dimensional array of dark optical trap sites 22 that can confine atoms 18 at near zeros of the optical intensity. Such arrays are traditionally prepared using six counterpropagating beams; however, the present invention employs a single laser that traverses a partially transmitting optical mask 34, for example, providing a set of spaced apertures arranged in rows and columns defining the separation of the trap sites 22. This optical mask 34 is followed by a 4 f Fourier filter 36 (for example, using conventional lenses and stops) operating as a low-pass filter to shape the light from the apertures into a two-dimensional pattern of near Gaussian holes in a uniform background.

The magnification of the optics of the Fourier filter 36 is chosen to give an array period of d in along x and z axes. The Talbot effect leads to repetition of the planar pattern of holes at axial spacings along the y-axis at the Talbot length $L_T = \lambda / \sqrt{1 - \lambda^2/d^2}$, where $\lambda$ is the wavelength of the trapping light (803 nm in this example). Taking d=0.9 μm and $\lambda$=0.803 μm gives $L_T$=1.46 μm with a trap region 20 being a cube of size w=250 μm on a side. This gives a total of $w^3/(d^2 L_T) = 1.3 \times 10^7$ trap sites 22. Additional details with respect to constructing such a system are provided in U.S. Pat. No. 10,559,392 assigned to the assignee of the present invention and incorporated by reference.

The trap sites 22 are stably occupied by only a single atom, and assuming a filling fraction of 0.5 the trap region 20, will hold a number of atoms Na=6.6×10⁶ atoms. In this regime of single atom occupancy, line width broadening due to atomic collisions is strongly suppressed.

The ability to trap atoms 18 in the trap sites 22 is dependent on matching between the wells of optical intensity and the energy or excitation states of the atoms 18 which varies during the transitions in energy states expected for operation of the clock. The wavelength of 803 nm is a so-called "magic" wavelength which serves to effectively trap the atoms 18 in both of their excited and ground states. Magic conditions occur for wavelengths near where the AC Stark shift is the same for the ground and excited state, and in this case other magic wavelengths exist between 0.6 and 0.9 um at which the states have a negative polarizability suitable for dark optical traps. Another example magic wavelength is 683 nm; however, the wavelength of 803 nm limits the optical power needed for trapping.

Referring again to FIG. 1, light may be conducted away from the chamber 12 from the trap region 20, for example, through the use of the beam splitter placed on the optical path between the laser 24a and the chamber 12 diverting light to a photodetector 27. The photodetector 27 is sensitive to a wavelength of 852 nm as will be discussed below.

A controller 28, for example, including one or more processors 30 and a computer memory 31 holding a stored program 35 may control each of the source 16, the lasers 24, and the AOMs 26 whose operation will be discussed in more detail below. The controller 28 may also receive an intensity signal from the photodetector 27 and a timing signal 33 from the laser 24a indicating the laser operating frequency (for example, using a frequency comb) which in turn will form a time base for a clock signal 34 output by the controller 32 as the output of the atomic clock, Together, the controller 28 and photodetector 27 and AOM 26b generally implement a lock circuit locking the frequency of the laser 24a to a selected atomic transition to be discussed below, thus producing the clock signal 34.

Referring still to FIG. 2, the light from each of the lasers 24a-24b may be conducted to the trap region 20 by fiber optics 40a and 40b, respectively, generally aligned in opposition about the trap region 20 along the x-axis. The ends of the fiber optics 40 opposed across the trap region 20 may be shaped and coated to form an opposed, concave, partially transmissive, mirrored surface to create an optical resonator 41 about the trap region 20. This optical resonator 41 helps suppress Doppler broadening and recoil heating by limiting operation of the clock to the resolved side-band limit with a small Lamb-Dicke parameter η. The excited state linewidth 42 of the cesium atoms (shown in FIG. 5 and as will be discussed) is $\Delta v = 2\pi = 124$ kHz which should be small compared to the trap vibrational frequency along the axis of the probe beam. To achieve a high vibrational frequency, the optical resonator 41 promotes a standing wave at an axial vibrational frequency of 1.05 MHz. When the clock transition is probed at unit saturation, the relative absorption at the first vibrational sideband is negligible and the Lamb-Dicke parameter η is 0.078 which adds further suppression to the sideband excitation.

Generally, the trap-forming laser 24b and lasers 24a and 24c propagate in orthogonal directions with the same electric field polarization. The beams can be detuned by a few MHz to remove interference effects without compromising the tong time clock stability.

Figure 3:
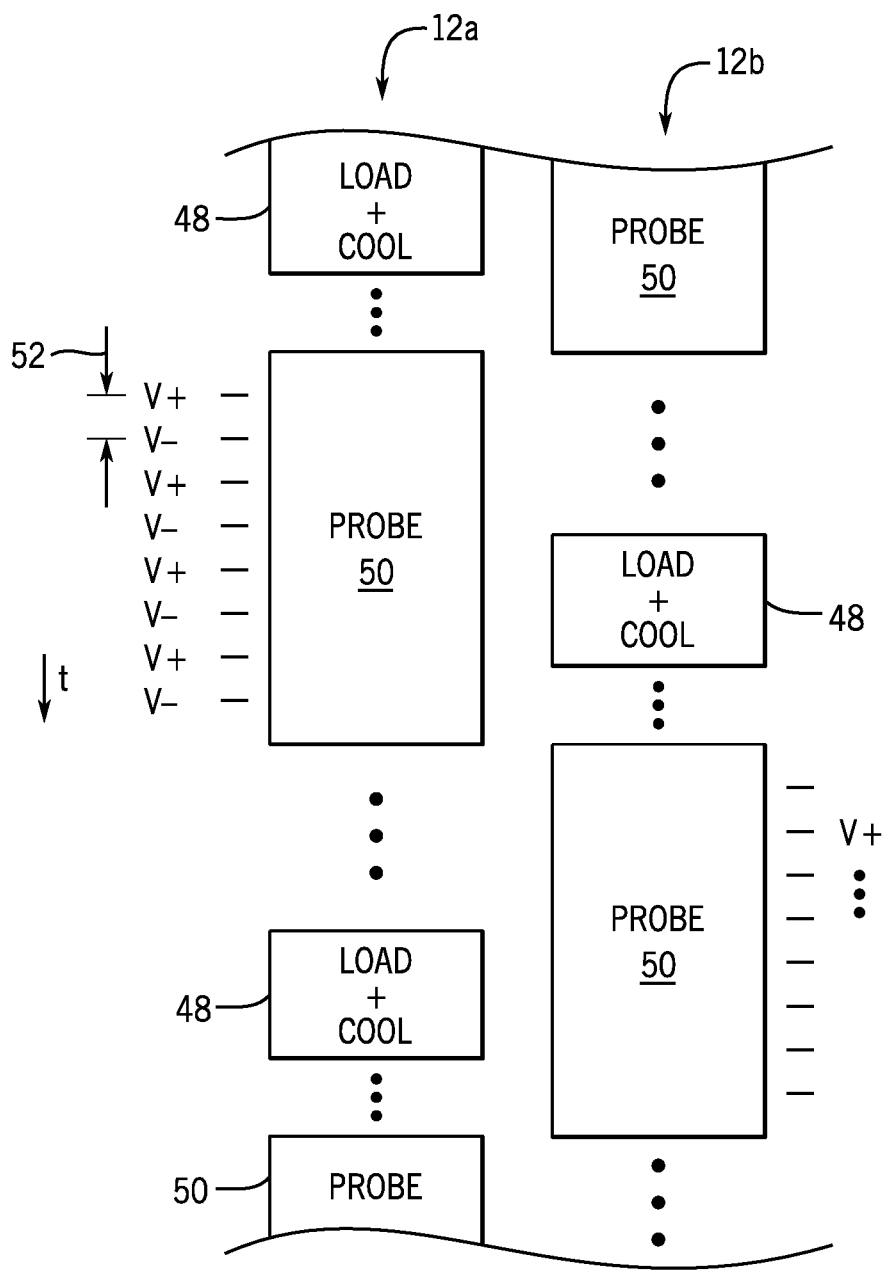
FIG. 3 is a process flow chart showing continuous operation of the clock by switching between the two chambers during an extended probing time.

Referring now to FIGS. 1 and 3, during operation of the clock 10, the controller 32 may control each of the chambers 12 through repeated and successive loading stage 48 and probing stage 50. Importantly, these stages are staggered for the different chambers 12a and 12b so that continuous probing of one or the other chamber can be obtained for continued control of the clock frequency.

Figure 4:
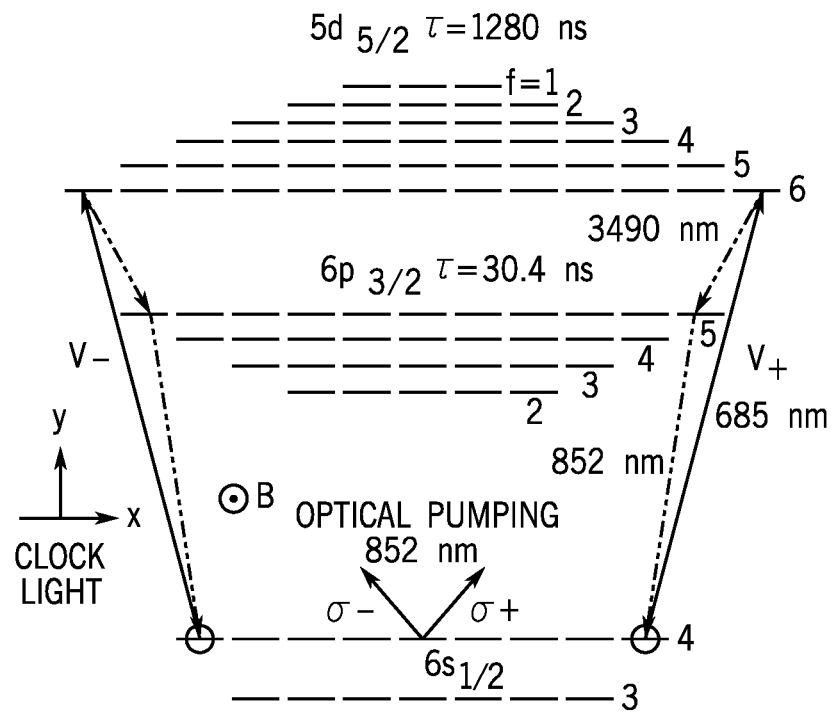
FIG. 4 is a representation of the atomic energy states of cesium showing the energy transitions employed in one embodiment of the invention.

Referring now to FIGS. 2 and 4, during the loading stage 48, the alkali metal source 16 may discharge alkali metal atoms 18 into the trap region 20 where they will be cooled and captured by the trap sites 18 and moved into the desired energy states as depicted in FIG. 4. This process employs a two-step cooling process starting with an illumination of the trapped atoms 18 with light from the laser 24a providing a wavelength of 852 nm and cooling the atoms 18 in a $6s_{1/2}$, f=4→6 $p_{3/2}$, f=5 transition. A repumping can also be performed from f=3 using the 24a by adding a 9.2 GHz sideband. Cold clouds of >10⁶ atoms can be prepared in much less than one second using this approach.

A second stage cooling uses laser 24c operating at a wavelength of 685 nm and frequency tuned to the red of the $6s_{1/2}$, f=4→$5d_{5/2}$, f=6 transition which has a Doppler temperature of 3.0 μK.

During the succeeding probing stage 50, the atoms 18 will be probed with the laser 24c at 685 nm, and light from decay of the probed atoms 18 will be monitored at 852 nm by the photodetector 27. Referring now also to FIG. 4, generally, the probing pulse at 685 nm will excite the atoms 18 from the $6s_{1/2}$, f=4→$5d_{5/2}$, f=6, transition. This transition represents an electric dipole forbidden transition. Light will then be monitored from the decay of the atomic state between 6 $p_{3/2}$, f=5→$6s_{1/2}$, f=4 transition emitting light at a wavelength of 852 nm.

Environmental magnetic fields will create a Zeeman splitting of these transition levels which may be compensated for by dividing the probing process to employ variations on these transitions having endpoints at Zeeman split levels that respond oppositely to the magnetic field. In particular, the probing may alternate the transitions of $6s_{1/2}$, f=4, m=±4→$5d_{5/2}$, f=6, m=±6, the values of m indicating the magnetic quantum numbers which designate Zeeman split levels (hyperfine states). Limiting the atomic population to these quantum magnetic numbers of m=±4 and m=±6 is possible by polarization of the pumping laser 24c along the y-axis, By alternating between pumping between the transitions of $6s_{1/2}$, f=4, m=+4→$5d_{5/2}$, f=6, m=+6 and $6s_{1/2}$, f=4, m=−4→$5d_{5/2}$, f=6, m=−6 (which will vary in opposite directions with magnetic field strength) and averaging these values, sensitivity to magnetic field strength is reduced. The precise pumping of the particular transition may be promoted by a slight frequency shift in the pumping laser 24a using the AOM 26a.

These different sequential probings are depicted in FIG. 3 (as v⁺ and v⁻) occurring during the probing stage 50 and may occur at a frequency 52 of 10 kHz. In an alternative approach, two different trap regions 20 may be simultaneously probed at the different frequencies, an approach which in its fullest implementation requires each of chambers 12a and 12b to be duplicated.

The ability of the probing stage 50 to extend for multiple seconds allows this multiple probing to greatly increase the sampling speed of the atomic clock improving its signal-to-noise ratio. This long-duration probing stage 50 also makes possible the overlapping of probing stages 50 of the two chambers 12a and 12b because the loading stage 48 can be completed in less than the time duration of the probing of the other chamber 12. As a result, there need be no time period when the clock 10 is not being locked to current probe signals such as might produce drift.

Figure 5:
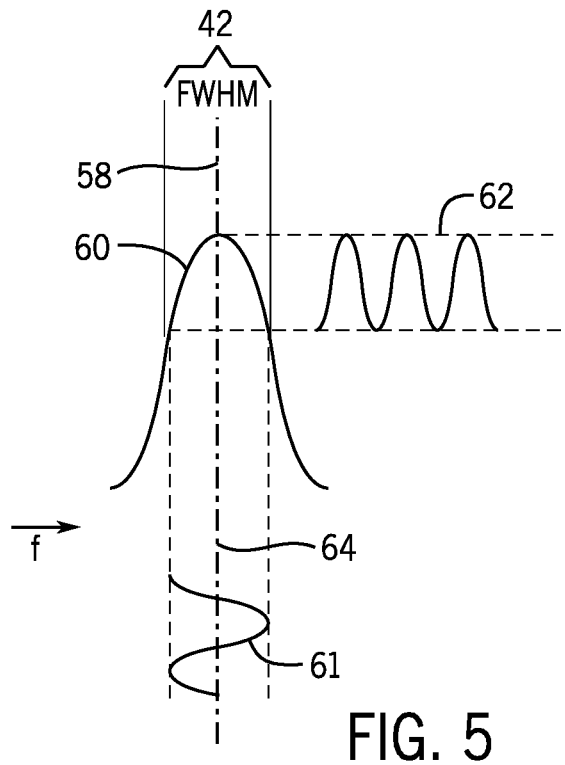
FIG. 5 is a graph showing modulation of the pumping laser for use in feedback control of the clock signal.

Referring now to FIGS. 1 and 5, as noted, the clock signal 34 may be generated by a timing signal 33 measuring of the frequency of laser 24c, for example, produced using a frequency comb. The frequency of the probing laser 24c, in turn, may be locked to the light from the 6 $p_{3/2}$, f=5, →$6s_{1/2}$, f=4, transition by monitoring the center frequency 58 of the 852 nm light received from the cesium atoms 18 by the photodetector 27 using a modulation technique. In this regard, the controller 32 modulates the light from the laser 24c using a modulation signal 61 typically substantially higher than the probing frequency 52, for example, at 100 kHz. This modulation will cause a fluctuation in the light returned to the photodetector 27 as a result of the shape of the line width 60 of the 852 nm light, changing its phase with respect to the modulating signal 61 depending on whether the center frequency 64 of the laser 24a is above or below the peak of the line width 60 (briefly doubling in frequency when the frequencies are perfectly aligned). In this way, an error signal is deduced and provides the ability to produce a feedback loop adjusting the frequency of laser 24c. The inventors believe that the resulting clock can produce stability of less than one nanosecond of drift over 30 days using a simple architecture with only three lasers.

The invention contemplates that the individually trapped cesium atoms arranged at micrometer scale spacings may be entangled by Rydberg interactions. Combining the architecture described here with Rydberg, mediated entanglement may provide a feasible route towards quantum enhanced clock performance. The optical clock may also be combined with a standard microwave clock using the transition between the $6s_{1/2}$ f=3 and f=4 levels at 9.2 GHz.

Certain terminology is used herein for purposes of reference only, and thus is not intended to be limiting. The term "lattice" or "lattice trap" describes multiple spaced trap locations in one, two, or three dimensions. Terms such as "upper", "lower", "above", and "below" refer to directions in the drawings to which reference is made, Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a controller" can be understood to include discrete processing circuitry or one or more microprocessors that can communicate in a stand-alone and/or a distributed environment(s), and can thus be configured to communicate via wired or wireless communications with other processors, where such one or more processors can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

What we claim is:

1. An optical atomic clock comprising:
   a source of alkali metal atoms;
   a trapping laser providing at least one optical trap holding the atoms received from the source;
   a clock laser exciting the trapped atoms in transition from a ground state to an optical excited energy state; and
   a lock circuit monitoring light from decay of the trapped atoms from the optical excited energy state to the ground state to adjust the frequency of the clock laser for use as a clock output;
   wherein the transition between the ground state and the excited energy state is an electric dipole forbidden transition of the alkali metal atoms.

2. The optical atomic clock of claim 1 wherein the alkali metal atoms are cesium.

3. The optical atomic clock of claim 2 wherein the clock laser provides a wavelength of 685 nm to probe a transition of neutral cesium atoms between $6s_{1/2}$ and $5d_{5/2}$ states.

4. The optical atomic clock of claim 2 wherein the trapping laser provides an optical trap using a wavelength selected from the group consisting of 803 nm and 683 nm.

5. The optical atomic clock of claim 1 wherein the trapping laser produces a lattice trap having multiple trap locations arrayed at multiple separated locations.

6. The optical atomic clock of claim 5 wherein multiple trap locations include locations spaced apart in each of three dimensions.

7. The optical atomic clock of claim 6 wherein the lattice trap employs a single laser creating multiple trap locations from Talbot patterns in electromagnetic energy passing through a set of diffraction orifices over a two-dimensional array.

8. The optical atomic clock of claim 5 wherein each of the locations stably holds only a single atom.

9. The optical atomic clock of claim 5 wherein each of the locations provides a single defined polarization of trap light.

10. The optical atomic clock of claim 1 wherein the optical trap is placed within an optical resonator tuned to a frequency of the clock laser.

11. The optical atomic clock of claim 8 wherein the optical resonator provides opposed mirrors including one mirror surface formed from an end of a fiber optic communicating between the trap and the trapping laser.

12. The optical atomic clock of claim 1 wherein the lock circuit analyzes the light from the decay of trapped atoms between different magnetic quantum numbers having opposite responses to magnetic fields to compensate for external magnetic fields.

13. The optical atomic clock of claim 1 further including two different traps and wherein the lock circuit alternately switches from receiving light from the first trap to receiving light from the second trap while the first trap is replenished with atoms, and from receiving light from the second trap to receiving light from the first trap when the second trap is replenished with atoms to allow continuous regulation of the clock output.

14. The optical atomic clock of claim 1 further including an additional laser providing at least one of a cooling of the atoms to microkelvin motional temperatures and an optical pumping of the atoms to predetermined hyperfine states.

15. The optical atomic clock of claim 1 wherein the clock laser further provides a cooling of the atoms to the ground state.

16. The optical atomic clock of claim 1 wherein the clock provides an accuracy of less than 2 ns drift per month.

17. The optical atomic clock of claim 1 wherein the lock circuit operates to load a first set of atoms into the trap and to probe the first set of atoms with respect to a ground state and excited energy state and monitor light from the decay of trapped atoms to the ground state multiple times over a probing period before loading a second set of the trap.

18. The optical atomic clock of claim 17 wherein the probing period is more than one second.

19. The optical atomic clock of claim 17 wherein the atoms at the trap sites are entangled by Rydberg interactions.

20. An optical atomic clock comprising:
a source of alkali metal atoms;
a first laser providing at least one optical trap holding atoms received from the source in a lattice of trap sites arrayed in three dimensions, the light at each trap site characterized by a single polarization value;
a second laser optically probing the trapped atoms from a ground state to an excited energy state; and
a lock circuit receiving light from the decay of trapped atoms to the ground state to generate a clock output signal;
wherein the transition between the ground state and the excited energy state is an electric dipole forbidden transition of the alkali metal atoms.

21. A method of timekeeping using an optical atomic clock having:
a source of alkali metal atoms;
a trapping laser providing at least one optical trap holding the received atoms;
a clock laser optically probing the trapped atoms in transition from a ground state to an optical excited energy state; and
a lock circuit monitoring light from decay of trapped atoms from the optical excited energy state to the ground state to adjust the frequency of the clock laser for use as a clock output, the method including:
(a) loading the alkali metal atoms into the optical trap;
(b) exciting the trapped atoms to an excited state using the clock laser; and
(c) monitoring light from decay of the trapped atoms to the ground state from the excited energy state to adjust the clock laser as a clock output;
wherein the transition between the ground state and the excited energy state is an electric dipole forbidden transition of the alkali metal atoms.

* * * * *